US007973599B2

(12) United States Patent
Takahashi

(10) Patent No.: US 7,973,599 B2
(45) Date of Patent: Jul. 5, 2011

(54) AMPLIFICATION CONTROL DEVICE, TEST SIGNAL GENERATION MODULE, TEST DEVICE, AMPLIFICATION CONTROL METHOD, PROGRAM, AND RECORDING MEDIUM

(75) Inventor: Satoshi Takahashi, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/523,395

(22) PCT Filed: Jan. 24, 2008

(86) PCT No.: PCT/JP2008/051468

§ 371 (c)(1),
(2), (4) Date: Sep. 1, 2009

(87) PCT Pub. No.: WO2008/096653

PCT Pub. Date: Aug. 14, 2008

(65) Prior Publication Data

US 2010/0045371 A1 Feb. 25, 2010

(30) Foreign Application Priority Data

Feb. 8, 2007 (JP) ................................. 2007-029642

(51) Int. Cl.
*H03G 3/20* (2006.01)

(52) U.S. Cl. .......................................... 330/96; 330/129

(58) Field of Classification Search .......... 330/278–279, 330/129, 96, 254
See application file for complete search history.

(56) References Cited

U.S. PATENT DOCUMENTS

| | | | | |
|---|---|---|---|---|
| 7,323,945 | B2 * | 1/2008 | Cyr et al. | ........................ 331/16 |
| 2007/0069766 | A1 | 3/2007 | Nakada | |
| 2008/0018322 | A1 | 1/2008 | Kurosawa et al. | |
| 2008/0036470 | A1 | 2/2008 | Kurosawa | |

FOREIGN PATENT DOCUMENTS

| | | |
|---|---|---|
| JP | 60-71968 | 4/1985 |
| JP | 2-100506 | 4/1990 |
| JP | 4-372875 | 12/1992 |
| JP | 5-52883 | 3/1993 |
| JP | 6-260861 | 9/1994 |
| JP | 9-23124 | 1/1997 |
| JP | 11-154839 | 6/1999 |
| JP | 2003-75493 | 3/2003 |
| JP | 2004-72339 | 3/2004 |
| JP | 2006-184186 | 7/2006 |

OTHER PUBLICATIONS

English language Abstract of JP 11-154839, Jun. 8, 1999.
English language Abstract of JP 9-23124, Jan. 21, 1997.
English language Abstract of JP 2004-72339, Mar. 4, 2004.
English language Abstract of JP 6-260861, Sep. 16, 1994.
English language Abstract of JP 2-100506, Apr. 12, 1990.
English language Abstract of JP 5-52883, Mar. 2, 1993.
English language Abstract of JP 2006-184186, Jul. 13, 2006.
English language Abstract of JP 2003-75493, Mar. 12, 2003.
English language Abstract of JP 60-71968, Apr. 23, 1985.
English language Abstract of JP 4-372875, Dec. 25, 1992.

* cited by examiner

*Primary Examiner* — Hieu P Nguyen
(74) *Attorney, Agent, or Firm* — Greenblum & Bernstein, P.L.C.

(57) ABSTRACT

An amplification control device for controlling a variable-gain amplifier the amplification factor of which is controlled based on an analog control signal, and which amplifies an analog input signal and outputs an analog output signal, includes component acquisition means that transforms, by the discrete Fourier transform, a digital output signal converted from the analog output signal into digital form by an A/D converter, thereby acquiring a desired frequency component of the digital output signal, differentiating means that acquires a difference between the electric power of the frequency component acquired by the component acquisition means and a target value of the electric power of the frequency component, and digital control signal output means that outputs a digital control signal, based on the difference acquired by the differentiating means, for controlling the amplification factor of the variable-gain amplifier, in which the analog control signal is obtained by converting the digital control signal into analog form by the D/A converter.

16 Claims, 9 Drawing Sheets

(a)

(b)

AMPLIFICATION CONTROL DEVICE, TEST SIGNAL GENERATION MODULE, TEST DEVICE, AMPLIFICATION CONTROL METHOD, PROGRAM, AND RECORDING MEDIUM

TECHNICAL FIELD

The present invention relates to adjustment of a signal level.

BACKGROUND ART

Conventionally, there has been known a device which amplifies a signal by means of a variable-gain amplifier, outputs an amplified signal, detects the output by peak detection, processes the detected signal by means of an analog circuit (refer to FIG. 5 of Japanese Laid-Open Patent Publication (Kokai) No. H11-154839) or a digital circuit (refer to FIG. 1 and ABSTRACT of Japanese Laid-Open Patent Publication (Kokai) No. H11-154839), and controls the gain of the variable-gain amplifier based on a processing result.

However, according to the above described prior art, if the output signal of the variable-gain amplifier contains signals of multiple frequency components, it is not possible to maintain a constant level of a signal of a certain frequency component. This is because signals of all the frequency components are detected, when the output signal is detected by the peak detection.

It is therefore an object of the present invention to maintain a constant level of a signal of a certain frequency component of the output signal of the variable-gain amplifier.

DISCLOSURE OF THE INVENTION

According to the present invention, an amplification control device for controlling an amplification unit an amplification factor of which is controlled based on an analog control signal, and which amplifies an analog input signal and outputs an analog output signal, includes: a component acquisition unit that transforms, by the discrete Fourier transform, a digital output signal converted from the analog output signal into digital form, thereby acquiring a desired frequency component of the digital output signal; a differentiating unit that acquires a difference between the electric power of the frequency component acquired by the component acquisition unit and a target value of the electric power of the frequency component; and a digital control signal output unit that outputs, based on the difference acquired by the differentiating unit, a digital control signal for controlling the amplification factor of the amplification unit, wherein the analog control signal is obtained by converting the digital control signal into analog form.

According to the thus constructed amplification control device, an amplification control device for controlling an amplification unit an amplification factor of which is controlled based on an analog control signal, and which amplifies an analog input signal and outputs an analog output signal, can be provided.

A component acquisition unit transforms, by the discrete Fourier transform, a digital output signal converted from the analog output signal into digital form, thereby acquiring a desired frequency component of the digital output signal. A differentiating unit acquires a difference between the electric power of the frequency component acquired by the component acquisition unit and a target value of the electric power of the frequency component. A digital control signal output unit outputs, based on the difference acquired by the differentiating unit, a digital control signal for controlling the amplification factor of the amplification unit. The analog control signal is obtained by converting the digital control signal into analog form.

According to the present invention, the amplification control device may include a sample number setting unit that sets the number of samples used in the discrete Fourier transform carried out by the component acquisition unit, The sample number setting unit sets the number of the samples such that the number of samples in $(P+1)^{th}$ discrete Fourier transform carried out by the component acquisition unit can be larger than the number of samples in $P^{th}$ discrete Fourier transform where P is a positive integer.

According to the amplification control device of the present invention, the sample number setting unit may increase the number of samples when the number of times of the discrete Fourier transform carried out by the component acquisition unit exceeds a predetermined number of times.

According to the amplification control device of the present invention, the digital control signal output unit may include a control signal recording unit that records the digital control signal.

The control signal recording unit records, before a desired analog output signal is obtained, an appropriate control signal which is the digital control signal causing the desired analog output signal to be obtained when a predetermined analog input signal is fed to the amplification unit.

According to the amplification control device of the present invention, the appropriate control signal may be calculated based on the predetermined analog input signal and the desired analog output signal.

According to the amplification control device of the present invention, the appropriate control signal may be recorded in the control signal recording unit in a state in which the predetermined analog input signal is fed to the amplification unit, and the desired analog output signal is obtained; and the control signal recording unit may record the appropriate control signal before the desired analog output signal is obtained again after the state.

According to the amplification control device of the present invention, the digital output signal may be obtained by lowering the frequency of the analog output signal, and converting the resulting signal into digital form.

According to the present invention, a test signal generation module may include: the amplification control device according to the present invention; the amplification unit; an A/D converter that converts the analog output signal into digital form; a D/A converter that converts the digital control signal into analog form; and a test signal generator that generates a test signal for testing a device under test to which the analog output signal is fed, wherein the test signal is the analog input signal.

According to the present invention, a test device may include: the test signal generation module according to the present invention; a response analysis module that analyzes a response of the device under test when the analog output signal is fed; and a control unit that controls the test signal generator based on an operation of the response analysis module.

According to the present inventions an amplification control method for controlling an amplification unit an amplification factor of which is controlled based on an analog control signal, and which amplifies an analog input signal and outputs an analog output signal, includes: a component acquisition step that transforms, by the discrete Fourier transform, a digital output signal converted from the analog output signal into digital form, thereby acquiring a desired frequency component of the digital output signal; a differentiating step that acquires a difference between the electric power of the frequency component acquired by the component acquisition step and a target value of the electric power of the frequency component; and a digital control signal output step that outputs, based on the difference acquired by the differentiating step, a digital control signal for controlling the amplification factor of the amplification unit, wherein the analog control signal is obtained by converting the digital control signal into analog form.

The present invention is a program of instructions for execution by the computer to perform an amplification control process for controlling an amplification unit an amplification factor of which is controlled based on an analog control signal, and which amplifies an analog input signal and outputs an analog output signal, the amplification control process including: a component acquisition step that transforms, by the discrete Fourier transform, a digital output signal converted from the analog output signal into digital form, thereby acquiring a desired frequency component of the digital output signal; a differentiating step that acquires a difference between the electric power of the frequency component acquired by the component acquisition step and a target value of the electric power of the frequency component; and a digital control signal output step that outputs, based on the difference acquired by the differentiating step, a digital control signal for controlling the amplification factor of the amplification unit, wherein the analog control signal is obtained by converting the digital control signal into analog form.

The present invention is a computer-readable medium having a program of instructions for execution by the computer to perform an amplification control process for controlling an amplification unit an amplification factor of which is controlled based on an analog control signal, and which amplifies an analog input signal and outputs an analog output signal, the amplification control process including: a component acquisition step that transforms, by the discrete Fourier transform, a digital output signal converted from the analog output signal into digital form, thereby acquiring a desired frequency component of the digital output signal; a differentiating step that acquires a difference between the electric power of the frequency component acquired by the component acquisition step and a target value of the electric power of the frequency component; and a digital control signal output step that outputs, based on the difference acquired by the differentiating step, a digital control signal for controlling the amplification factor of the amplification unit, wherein the analog control signal is obtained by converting the digital control signal into analog form.

BEST MODE FOR CARRYING OUT THE INVENTION

A description will now be given of an embodiment of the present invention with reference to drawings.

First Embodiment

Figure 1:
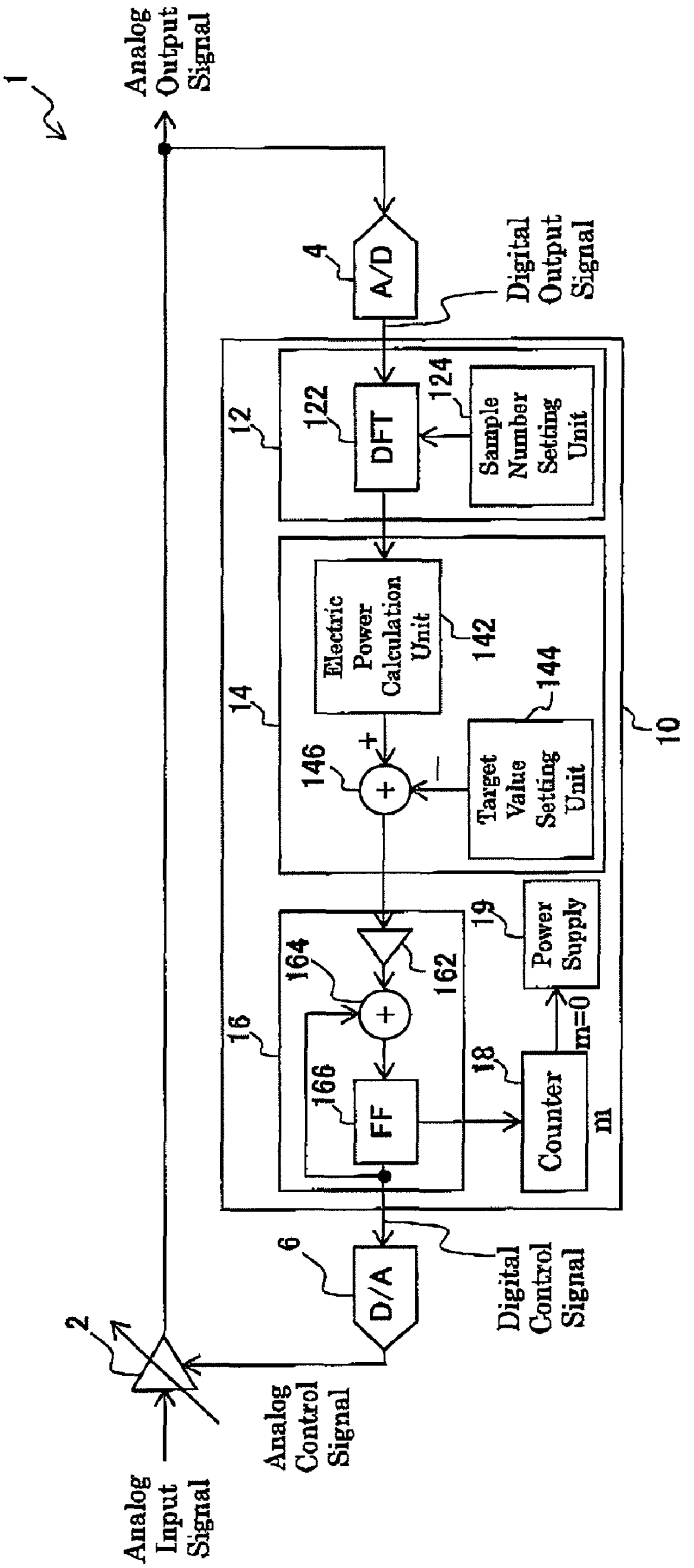
FIG. 1 is a block diagram showing a configuration of an amplification control device 10 according to a first embodiment of the present invention.

FIG. 1 is a block diagram showing a configuration of an amplification control device 10 according to a first embodiment of the present invention. The amplification control device 10 is used to control a variable-gain amplifier (amplification means) 2.

The amplification factor or gain of the variable-gain amplifier 2 is controlled based on an analog control signal. Moreover, the variable-gain amplifier 2 amplifies an analog input signal (such as an RP (Radio Frequency) signal), and outputs an analog output signal. It should be noted that the variable-gain amplifier 2 is connected, via an A/D converter 4 and a D/A converter 6, to the amplification control device 10. The A/D converter 4 receives the analog output signal, converts the analog output signal into digital form, and outputs a resulting signal. The output of the A/D converter 4, namely the signal obtained by converting the analog output signal into digital form is referred to as digital output signal. The D/A converter 6 outputs the analog control signal. The analog control signal is obtained by converting a digital control signal described later into analog form. In other words, the D/A converter 6 receives the digital control signal, converts the digital control signal into analog form, and outputs the analog control signal.

The analog output signal includes signals of multiple frequency components. The amplification control device 10 controls the variable-gain amplifier (amplification means) 2 in order to cause a signal of a certain frequency component of the analog output signal to maintain a constant level.

It should be noted that an amplification system 1 includes the variable-gain amplifier 2, the A/D converter 4, the D/A converter 6, and the amplification control device 10.

The amplification control device 10 includes component acquisition means 12, differentiating means 14, digital control signal output means 16, a counter 18, and a power supply 19.

The component acquisition means 12 transforms the digital output signal output by the A/D converter 4 by means of the discrete Fourier transform (DFT), thereby acquiring a desired frequency component of the digital output signal.

The component acquisition means 12 includes a DFT unit 122 and a sample number setting unit 124.

The DFT unit 122 transforms the digital output signal by means of the DFT. The DFT is defined by a following equation (1).

$$X_k = \sum_{n=0}^{N-1} x_n \cdot \exp(-j \cdot 2\pi kn / N) \quad (1)$$

wherein $x_n=\{x_0, x_1, \ldots, x_{N-1}\}$ represents a digital signal series of the digital output signal, N denotes the sample number (number of samples) of the DFT, and k denotes a kth frequency point when the DFT is carried out for the sample number of N. $X_k$ denotes a result of the DFT at the frequency point k. The DFT unit 122 receives $x_n=\{x_0, x_1, \ldots, x_{N-1}\}$, and outputs $X_k$.

When the sampling frequency of the A/D converter 4 is fs, the result $X_k$ of the calculation of the equation (1) represents a component at a frequency f represented by the following equation (2).

$$f=(k/N)fs \quad (2)$$

For example, when the sampling frequency fs is 100 MHz, the number N of the samples is 100, and the frequency point k is 10, according to the equation (2), the DFT unit 122 outputs a component of 10 MHz. In this way, the DFT unit 122 transforms the digital output signal by means of the DFT, thereby acquiring a desired frequency component (such as a component of 10 MHz).

The sample number setting unit 124 sets the number of samples (sample number N) used in the DFT carried out by the DFT unit 122 of the component acquisition means 12.

According to the first embodiment, the number N of the samples and the frequency point k are set so as to transform, by the DFT, a signal of a frequency the level of which is to be maintained constant out of the signals of the multiple frequencies contained in the analog output signal. For example, if it is desired to maintain the level of the component of 10 MHz of the analog output signal constant, the number N of the samples is set to 100, and the frequency points k is set to 10 (when the sampling frequency fs is 100 MHz).

The differentiating means 14 acquires a difference between the electric power of the frequency component acquired by the component acquisition means 12 and a target value of the electric power of the frequency component. The differentiating means 14 includes an electric power calculation unit 142, a target value setting unit 144, and a subtractor 146.

The electric power calculation unit 142 calculates the electric power of the frequency component acquired by the component acquisition means 12. Specifically, the electric power calculation unit 142 calculates a sum of respective squares of the real part and the imaginary part of the output $X_k$ of the DFT unit 122. The target value setting unit 144 sets the target value of the electric power of the frequency component. The subtractor 146 subtracts an output (the target value of the electric power of the frequency component) of the target value setting unit 144 from an output (the electric power of the frequency component acquired by the component acquisition means 12) of the electric power calculation unit 142.

The digital control signal output means 16 outputs a digital control signal, based on the difference obtained by the differentiating means 14, for controlling the amplification factor of the variable-gain amplifier 2. The digital control signal output means 16 includes a multiplier 162, an adder 164, a flip-flop (control signal recording means) 166.

The multiplier 162 multiplies the difference obtained by the differentiating means 14 (output from the subtractor 146) by a predetermined constant, and outputs the multiplied signal.

The adder 164 adds data recorded in the flip-flop 166 and the output from the multiplier 162 to each other, and feeds the sum to the flip-flop 166, thereby recording the sum in the flip-flop 166.

The flip-flop (control signal recording means) 166 outputs the data ("digital control signal") recorded by itself to the D/A converter 6 and the adder 164. It should be noted that 0 (zero) is recorded in the flip-flop 166 before the flip-flop 166 receives the output from the adder 164. Moreover, when the record in the flip-flop 166 is rewritten, a signal indicating the rewrite of the record in the flip-flop 166 is fed to the counter 18.

It should be noted that the digital control signal fed to the D/A converter 6 is converted by the D/A converter 6 into analog form as the analog control signal. The analog control signal controls the amplification factor or gain of the variable-gain amplifier 2. For example, if the output of the subtractor 146 is positive, the amplification factor or gain of the variable-gain amplifier 2 is to be decreased. If the output of the subtractor 146 is negative, the amplification factor or gain of the variable-gain amplifier 2 is to be increased. The control of the amplification factor or gain of the variable-gain amplifier 2 according to the analog control signal is widely known, and a detailed description thereof is, therefore, omitted.

The counter 18 initially sets the number of times m which the component acquisition means 12, the differentiating means 14, and the digital control signal output means 16 repeat the above operations. Then, the counter 18, upon receiving the signal indicating the rewrite of the record in the flip-flop 166 from the flip-flop 166, decrements m by one at a time. Then, if m has reached 0 (zero), the counter 18 feeds a signal indicating an end of operation to the power supply 19.

The power supply 19 is a power supply for entire the amplification control device 10. The power supply 19, upon receiving the signal indicating the end of operation from the counter 18, stops the supply of the electric power for the entire amplification control device 10. As a result, the operation of the amplification control device 10 ends.

Figure 2:
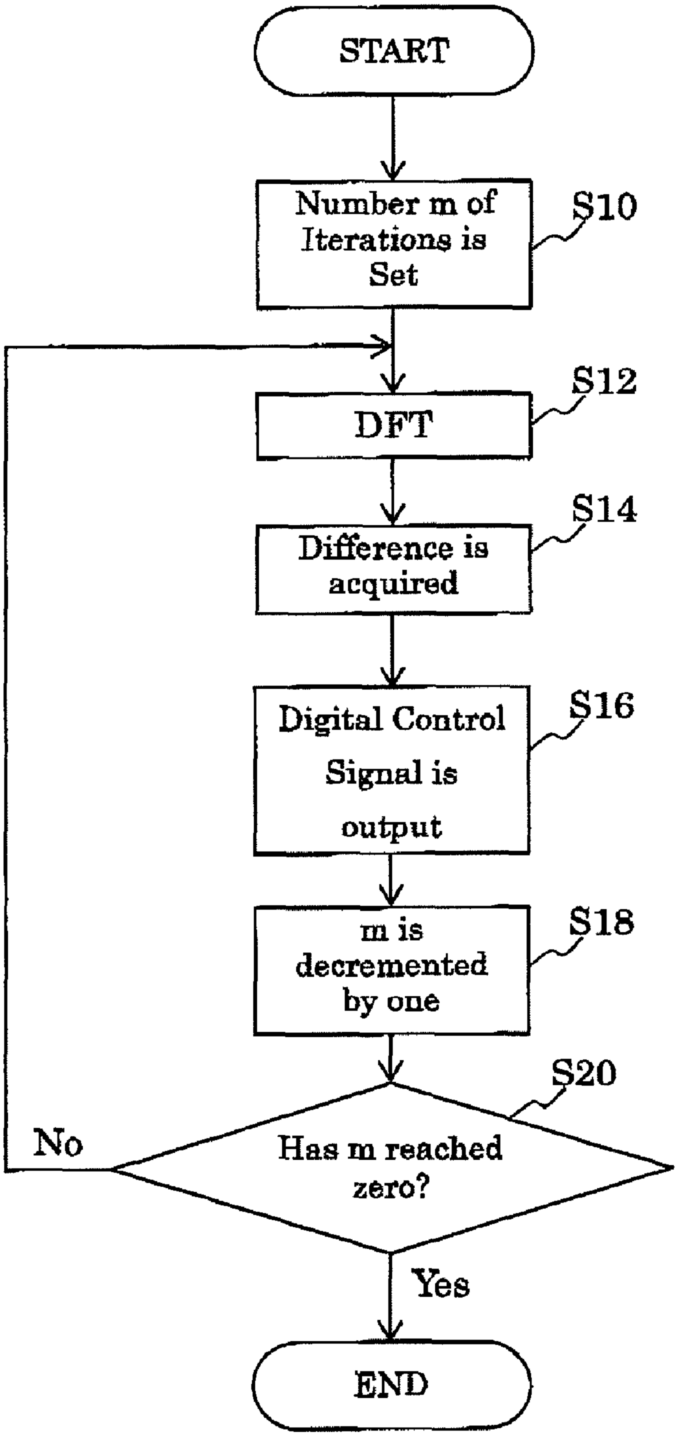
FIG. 2 is a flowchart showing the operation of the first embodiment.

A description will now be given of an operation of the first embodiment with reference to a flowchart in FIG. 2. FIG. 2 is a flowchart showing the operation of the first embodiment.

First, the number m of iterations is set to the counter 19 (S10). The number m is a positive integer.

Further, the analog input signal is fed to the variable-gain amplifier 2. The variable-gain amplifier 2 amplifies the analog input signal, and outputs the analog output signal. The analog output signal is converted by the A/D converter 4 into the digital output signal. The digital output signal is fed to the DFT unit 122 of the component acquisition means 12.

The DFT unit 122 transforms the digital output signal by means of the discrete Fourier transform (DFT) (S12). As a result, the desired frequency component of the digital output signal is acquired.

The differentiating means 14 receives the frequency component acquired by the DFT unit 122 of the component acquisition means 12, and calculates the electric power thereof in the electric power calculation unit 142. Then, the subtractor 146 subtracts the output of the target value setting unit 144 (namely the target value of the electric power of the frequency component) from the output of the electric power calculation unit 142, thereby acquiring a difference therebetween (S14).

The digital control signal output means 16 receives the difference from the subtractor 146 of the differentiating means 14, and multiplies the difference by the predetermined constant in the multiplier 162. The output from the multiplier 162 is added to the data recorded in the flip-flop 166 by the adder 164. The output from the adder 164 is written to the flip-flop 166. The flip-flop 166 records the written data. The data (digital control signal) recorded in the flip-flop 166 is output to the D/A converter 6 (S16). The D/A converter 6 receives the digital control signal, and outputs the analog control signal. The variable-gain amplifier 2 receives the analog control signal, and the amplification factor or gain of the variable-gain amplifier 2 is thus controlled.

Further, the flip-flop 166 feeds the signal indicating that the record in the flip-flop 166 has been rewritten to the counter 18. The counter 18, upon receiving this signal, decrements in by one (S18). Then, the counter 18 determines whether m has reached 0 (zero) or not (S20).

If m has not reached 0 ("NO" in S20), the processing returns to the DFT (S12). As a result, the DFT (S12), the differentiation (S14), and the output of the digital control signal (S16) are repeated. The digital control signal is converted by the D/A converter 6 into the analog control signal, the analog control signal is fed to the variable-gain amplifier 2, and the amplification factor or gain of the variable-gain amplifier 2 is controlled. While the control of the amplification factor or gain of the variable-gain amplifier 2 is being repeated, the level of the signal of the desired frequency component of the analog output signal converges.

When m has reached 0 ("YES" in S20), the counter 18 transmits the stop signal to the power supply 19, the electric power supply is stopped, and the processing ends.

It is understood from the above description that the DFT (S12), the differentiation (S14), and the output of the digital control signal (S16) are repeated m times in the amplification control device 10.

It should be noted that setting m to infinite may be permitted. In this case, until a user of the amplification control device 10 stops the supply of the electric power by the power supply 19, the DFT (S12), the differentiation (S14), and the output of the digital control signal (S16) are repeated.

According to the first embodiment of the present invention, only the signal of the desired frequency component can be extracted by the DFT unit 122 of the component acquisition means 12. Thus, if the analog output signal contains signals of multiple frequency components, it is possible to control the amplification factor or gain of the variable-gain amplifier 2 such that the level of the signal of a certain frequency component is constant.

Second Embodiment

The amplification control device 10 according to the second embodiment of the present invention is different from that of the first embodiment in that the number of samples (sample number N) changes according to the count of the counter 18.

Figure 3:
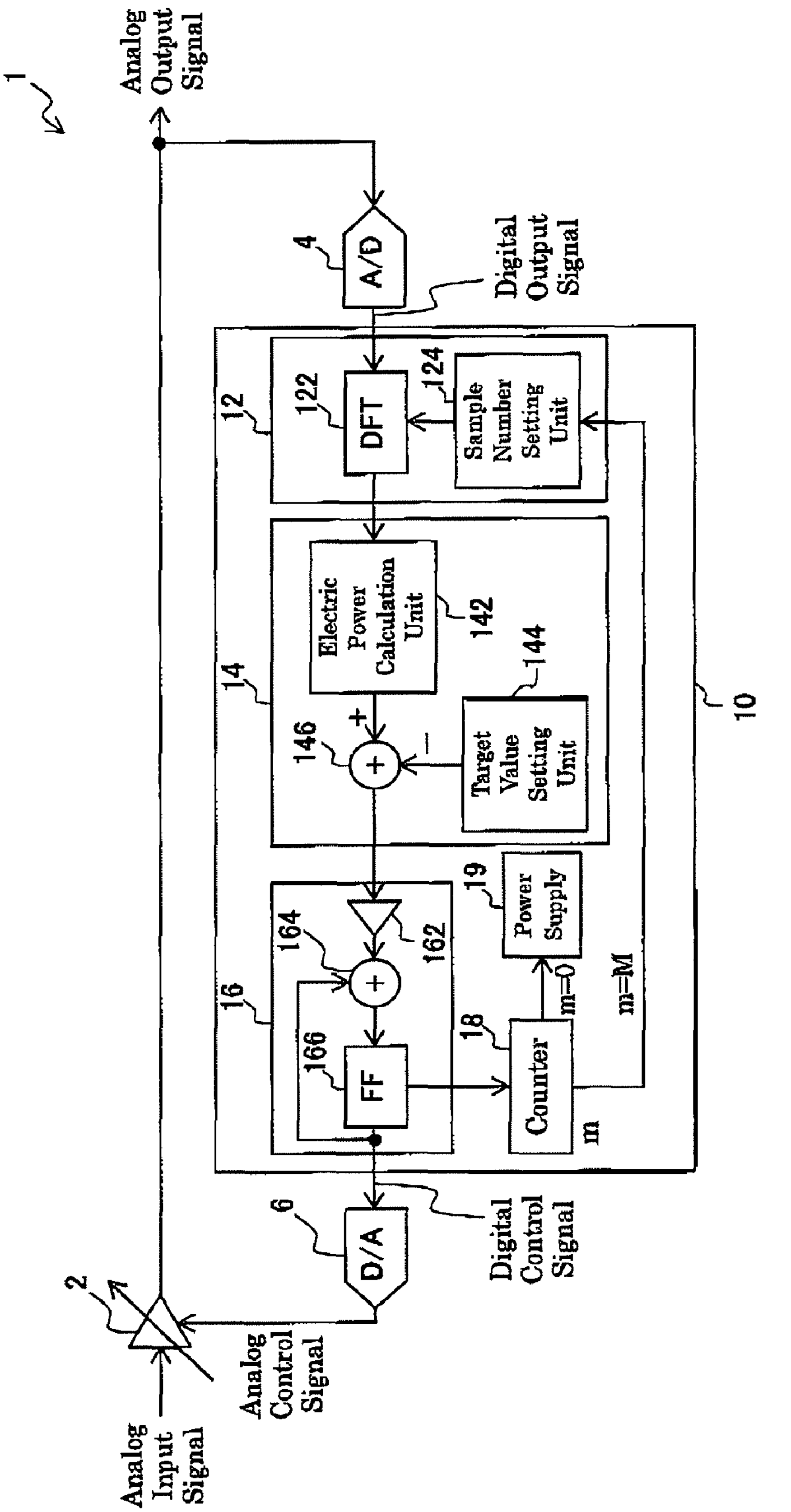
FIG. 3 is a block diagram showing a configuration of the amplification control device 10 according to the second embodiment of the present invention.

FIG. 3 is a block diagram showing a configuration of the amplification control device 10 according to the second embodiment of the present invention. The variable-gain amplifier 2, the A/D converter 4, and the D/A converter 6 are the same as those of the first embodiment, and a description thereof is, therefore, omitted. The amplification control device 10 includes the component acquisition means 12, the differentiating means 14, the digital control signal output means 16, the counter 18, and the power supply 19. In the following section, the same components are denoted by the same numerals as of the first embodiment, and will be explained in no more details.

The DFT unit 122, the differentiating means 14, the digital control signal output means 16, and the power supply 19 of the component acquisition means 12 are the same as those of the first embodiment, and a description thereof is, therefore, omitted.

A sample number setting unit 124 of the component acquisition means 12 sets the number of the samples such that the number of the samples (sample number N) in $(P+1)^{th}$ DFT carried out by the DFT unit 122 of the component acquisition means 12 can be larger than the number of the samples (sample number N) in $P^{th}$ DFT. It should be noted that the number P is a positive integer.

It should be noted that P may be a predetermined value. For example, P may be set to 10. In this case, if the number of times of the DFT carried out by the DFT unit 122 of the component acquisition means 12 exceeds a predetermined number of times (10 times), the number of samples is increased.

Figure 4:
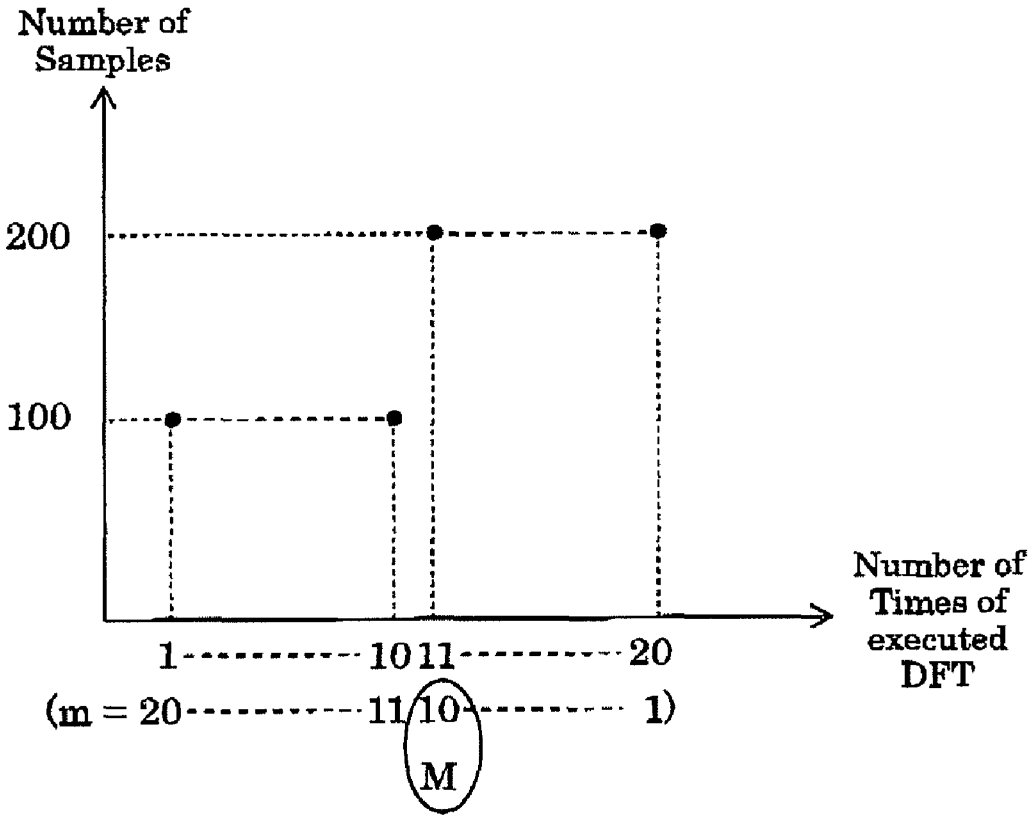
FIG. 4 is a diagram showing setting of the number of samples in the sample number setting unit 124 according the second embodiment.

FIG. 4 is a diagram showing setting of the number of samples in the sample number setting unit 124 according the second embodiment. It should be noted that the number of times m of the iterations of the DFT is 20. First, when the number of times of the executed DFT is 1 to 10, the number N of the samples is 100. When the number of times of the executed DFT is 11 to 20, the number N of the samples is 200. It should be noted that cases for the numbers of times of the operation of the DFT being 1, 10, 11, and 20 are shown in FIG. 4, and cases for the other numbers of times are omitted.

Moreover, the frequency of the component acquired by the DFT unit 122 is maintained constant by increasing the number N of the samples, and simultaneously increasing the frequency point k. When the number N of the samples is 100, and the frequency point k is 10, if the number N of the samples is increased to 200, as described above, k is simultaneously increased from 10 to 20. As a result, the frequency of the component acquired by the DFT unit 122 can be maintained constant (refer to the equation (2)).

As the number of times of the executed DFT increases as 1, 2, 3, . . . , the counter 18 decrements m by one at a time, and m thus decreases as 20, 19, 18, . . . . When the number of times of the executed DFT is 10, m is 11, and when the number is 11, m is 10. On this occasion, it is assumed that the value of m immediately after the number of the samples has been changed (the number of times of the executed DFT is 11) is M (=10). M is obtained as m−P.

The counter 18 operates as in the first embodiment. When m has reached M, the counter 18 supplies the sample number setting unit 124 with a signal indicating that the number of samples is to be changed.

Figure 5:
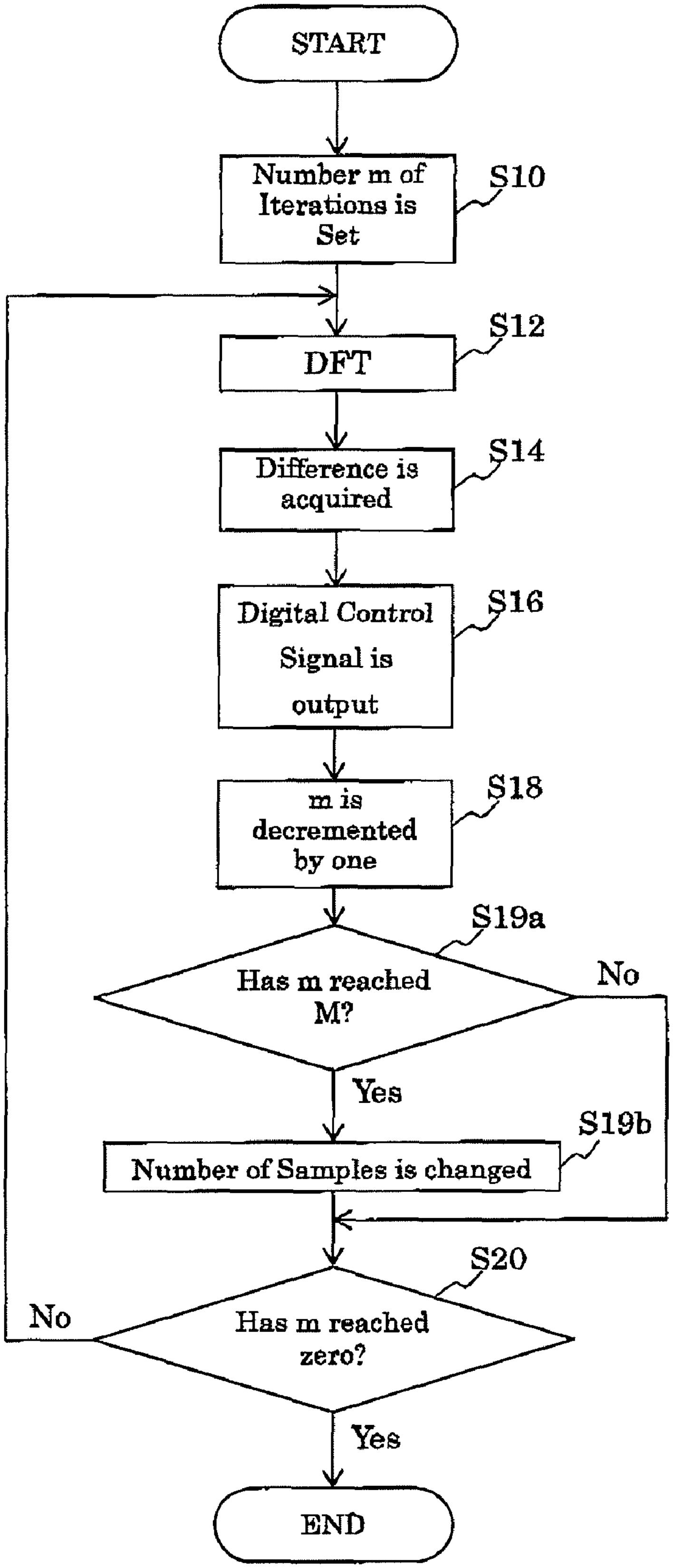
FIG. 5 is a flowchart showing the operation of the second embodiment.

A description will now be given of an operation of the second embodiment with reference to a flowchart in FIG. 5. FIG. 5 is a flowchart showing the operation of the second embodiment.

First, the number m of iterations is set to the counter 19 (S10). The number m is a positive integer.

Further, the analog input signal is fed to the variable-gain amplifier 2. The variable-gain amplifier 2 amplifies the analog input signal, and outputs the analog output signal. The analog output signal is converted by the A/D converter 4 into the digital output signal. The digital output signal is fed to the DFT unit 122 of the component acquisition means 12.

The DFT unit 122 transforms the digital output signal by means of the discrete Fourier transform (DFT) (S12). As a result, the desired frequency component of the digital output signal is acquired.

The differentiating means 14 receives the frequency component acquired by the DFT unit 122 of the component acquisition means 12, and calculates the electric power thereof in the electric power calculation unit 142. Then, the subtractor 146 subtracts the output of the target value setting unit 144 (namely the target value of the electric power of the frequency component) from the output of the electric power calculation unit 142, thereby acquiring a difference therebetween (S14).

The digital control signal output means 16 receives the difference from the subtractor 146 of the differentiating means 14, and multiplies the difference by the predetermined constant in the multiplier 162. The output from the multiplier 162 is added to the data recorded in the flip-flop 166 by the adder 164. The output from the adder 164 is written to the flip-flop 166. The flip-flop 166 records the written data. The data (digital control signal) recorded by the flip-flop 166 is output to the D/A converter 6 (S16). The D/A converter 6 receives the digital control signal, and outputs the analog control signal. The variable-gain amplifier 2 receives the analog control signal, and the amplification factor or gain of the variable-gain amplifier 2 is controlled.

Further, the flip-flop 166 feeds the signal indicating that the record in the flip-flop 166 has been rewritten to the counter 18. The counter 18, upon receiving this signal, decrements m by one (S18).

Then, the counter 18 determines whether m has reached M or not (S19*a*). If m has reached M ("YES" in S19*a*), the counter 18 supplies the sample number setting unit 124 with the signal indicating that the number of samples is to be changed. Then, the sample number setting unit 124 changes the number of the samples (S19*b*). Then, the counter 18 determines whether m has reached 0 (zero) or not (S20). If m has not reached M ("NO" in S19*a*), namely m is not equal to M, the counter 18 determines whether m has reached 0 (zero) or not (S20).

Referring to the example in FIG. 4, when m is 20, 19, . . . , 11 (the number of times of the executed DFT is 1, 2, . . . , 10), m has not reached M (=10) "NO" in S19*a*), and the number of the samples (100) is thus not changed (S19*b*). When m has reached 10 (the number of times of the executed DFT is 11), since m has reached M ("YES" in 19*a*), the number of the samples is changed (S19*b*). In the case in FIG. 4, the number of the samples becomes 200. Subsequently, since the changed number of the samples (200) is used when the DFT is carried out (11th time), when the number of times of the executed DFT is 11, 12, . . . , 20, the changed number of the samples (200) is used.

If m has not reached 0 ("NO" in S20), the processing returns to the DFT (S12). As a result, the DFT (S12), the differentiation (S14), and the output of the digital control signal (S16) are repeated. The digital control signal is converted by the D/A converter 6 into the analog control signal, the analog control signal is fed to the variable-gain amplifier 2, and the amplification factor or gain of the variable-gain amplifier 2 is controlled. While the control of the amplification factor or gain of the variable-gain amplifier 2 is being repeated, the level of the signal of the desired frequency component of the analog output signal converges.

When m has reached 0 ("YES" in S20), the counter 18 transmits the stop signal to the power supply 19, the electric power supply is stopped, and the processing ends.

It is understood from the above description that the DFT (S12), the differentiation (S14), and the output of the digital control signal (S16) are repeated m times in the amplification control device 10.

It should be noted that setting m to infinite may be permitted. In this case, until a user of the amplification control device 10 stops the supply of the electric power by the power supply 19, the DFT (S12), the differentiation (S14), and the output of the digital control signal (S16) are repeated.

According to the second embodiment, there are obtained effects as those of the first embodiment. Moreover, when the number of times of the executed DFT is small, the number N of the samples is set to a smaller number, thereby increasing the speed of the calculation. Further, as the number of times of the executed DFT has become large, the level of the signal of the desired frequency component has converged, and the number N of the samples is increased to increase the precision of the calculation. Thus, high-speed and precise DFT, therefore high-speed and precise control of the variable-gain amplifier 2 can be carried out.

Figure 6:
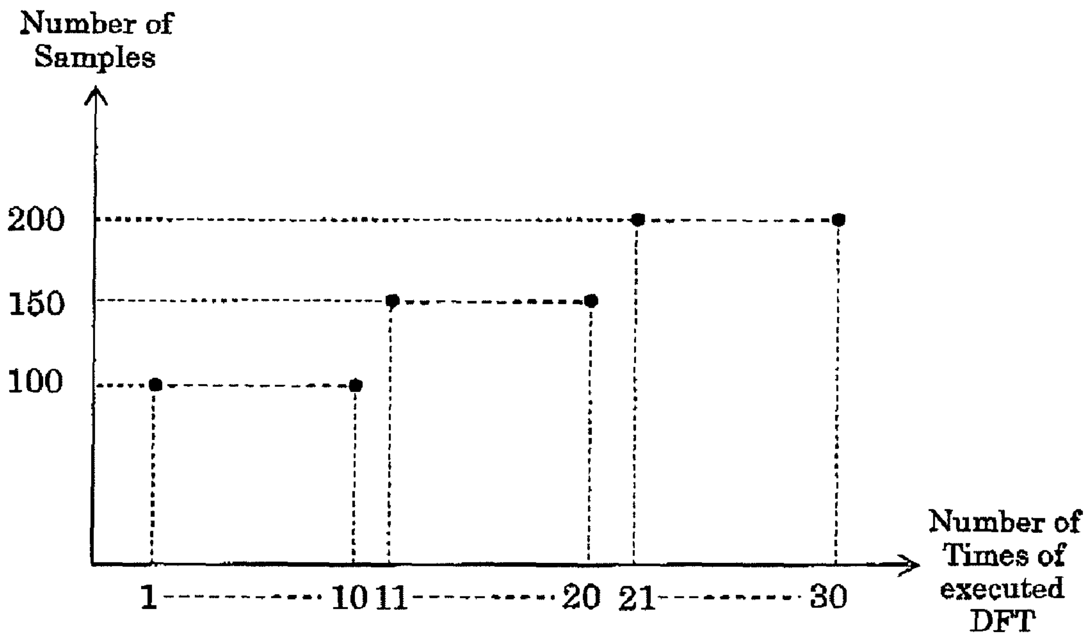
FIGS. 6(*a*) and 6(*b*) show further examples of the setting of the number N of the samples, FIG. 6(*a*) shows an example of the setting of the number N of the samples as three stages, and FIG. 6(*b*) shows an example in which the number N of samples increases as the number of times of the executed DFT increases.
Figure 6:
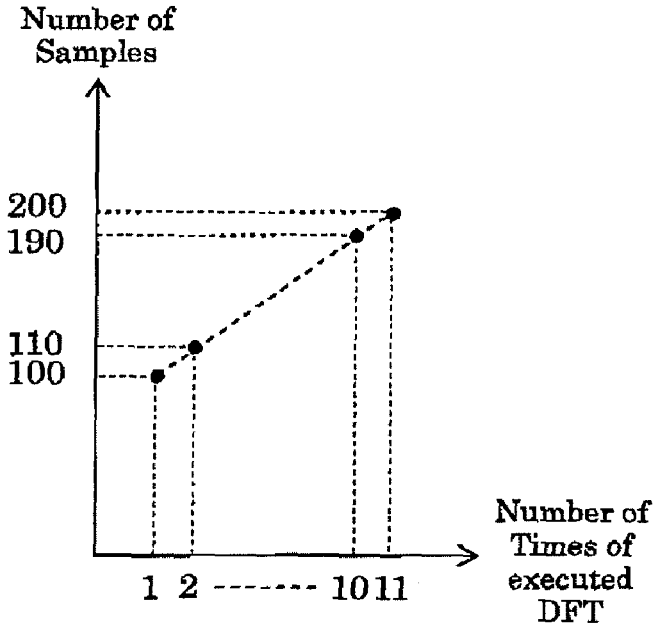

It should be noted that the setting of the number N of the sample is not limited to the example shown in FIG. 4 in which the number N of the samples is set as two stages. FIGS. 6(*a*) and 6(*b*) show further examples of the setting of the number N of the samples.

FIG. 6(*a*) shows an example of the setting of the number N of the samples as three stages. It should be noted that the number of times m of the iterations of the DFT is 30. First, when the number of times of the executed DFT is 1 to 10, the number N of the samples is 100. When the number of times of the executed DFT is 11 to 20, the number N of the samples is 150. When the number of times of the executed DFT is 21 to 30, the number N of the samples is 200. It should be noted that cases for the numbers of times of the operation of the DFT being 1, 10, 11, 20, 21, and 30 are shown in FIG. 6(*a*), and cases for the other numbers of times are omitted.

In the example shown in FIG. 6(*a*), the number of samples (sample number N) for the 11th DFT is larger than the number of samples (sample number N) for the 10th DFT. Further, the number of samples (sample number N) for the 21st DFT is larger than the number of samples (sample number N) for the 20th DFT.

FIG. 6(*b*) shows an example in which the number N of samples increases as the number of times of the executed DFT increases. It should be noted that the number of times m of the iterations of the DFT is 11. When the number of times of the executed DFT is T, the number N of samples is represented as: $N=100+10(T-1)$. It should be noted that cases for the numbers of times of the operation of the DFT being 1, 2, 10, and 11 are shown in FIG. 6(*b*), and cases for the other numbers of times are omitted.

In the example shown in FIG. 6(*b*), the number of samples (sample number N) for the $(Y+1)^{th}$ DFT is larger than the number of samples (sample number N) for the $Y^{th}$ DFT (Y is a positive integer from 1 to 10).

There has been given a description that the sample number setting unit 124 of the component acquisition means 12 sets the number of samples such that the number of samples (sample number N) in $(P+1)^{th}$ DFT carried out by the DFT unit 122 of the component acquisition means 12 can be larger than the number of samples (sample number N) in $P^{th}$ DFT (P is a positive integer).

In this case, P is not a number determined in advance. For example, the number of samples may be set according to how much the level of a desired frequency component of the analog output signal has been converged. More specifically, when the absolute value of the output of the subtractor 146 becomes equal to or less than a predetermined value, the number of samples can be increased. For example, it is assumed that, until the number of times of the executed DFT becomes 15, the absolute value of the output of the subtractor 146 is exceeding the predetermined value, and when the number of times of the executed DFT becomes 16, the output of the subtractor 146 becomes equal to or less than the predetermined value. In this case, when the number of times of the DFT carried out by the DFT unit 122 of the component acquisition means 12 exceeds 15, the number of the samples is increased.

In this case, since it is unknown how many times the DFT is repeated until the absolute value of the output of the subtractor 146 becomes equal to or less than the predetermined value before the operation of the amplification control device 10, P cannot be determined in advance. However, it is considered that the number of samples (sample number N) for the $(P+1)^{th}$ ($=16^{th}$) DFT executed by the DFT unit 122 of the component acquisition means 12 is larger than the number of samples (sample number N) for the $P^{th}$ ($=15^{th}$) DFT.

Third Embodiment

Though the amplification control device 10 according to the third embodiment of the present invention has the same configuration as that of the first and second embodiments, the third embodiment is different in that the digital control signal is recorded in the flip-flop 166 before the amplification control device 10 is used.

Since the configuration of the amplification control device 10 according to the third embodiment of the present invention is the same as that of the first and second embodiments, a description thereof is, therefore, omitted.

Figure 7:
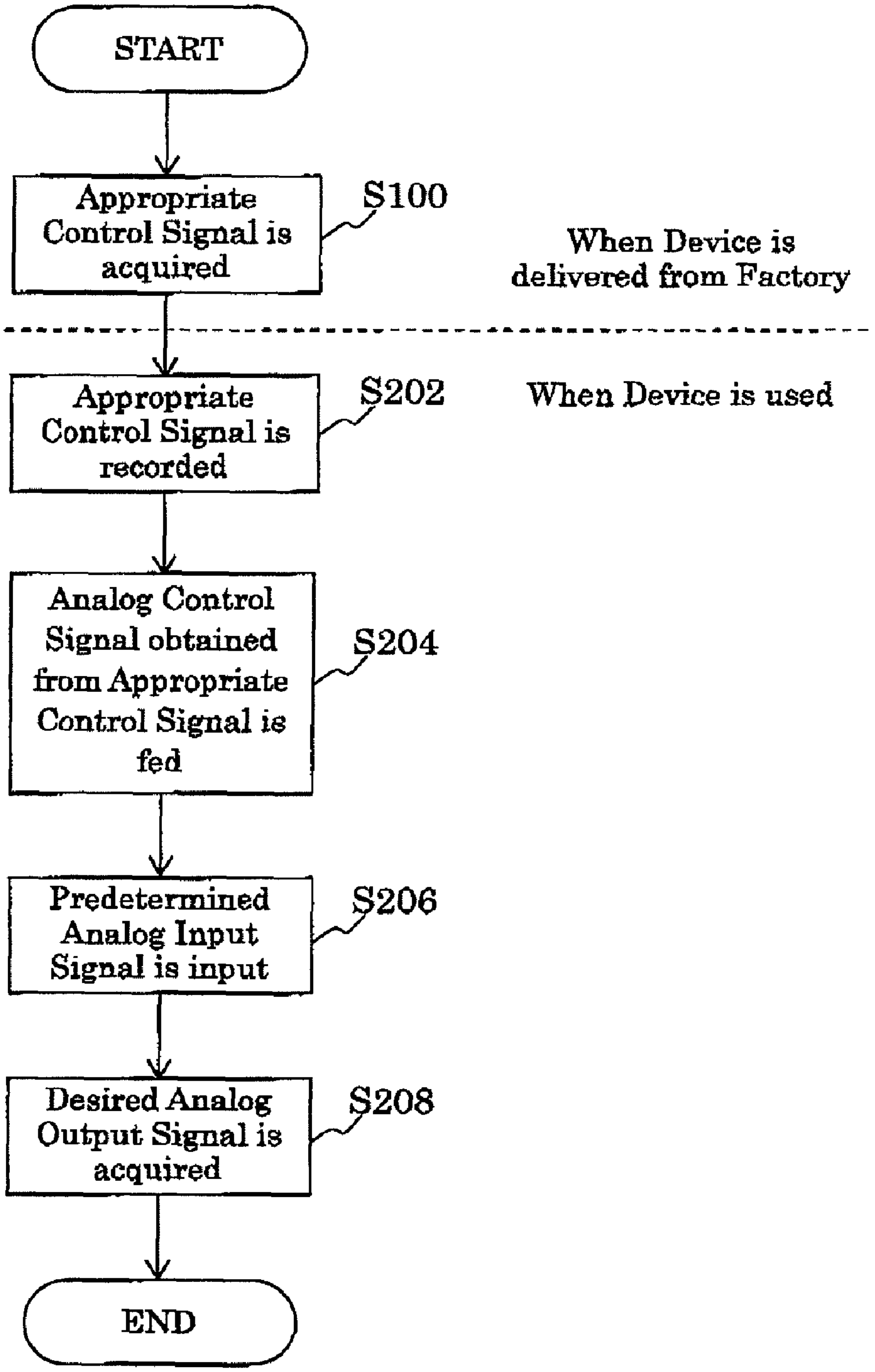
FIG. 7 is a flowchart showing the operation of the third embodiment.

A description will now be given of an operation of the third embodiment with reference to a flowchart in FIG. 7. FIG. 7 is a flowchart showing the operation of the third embodiment.

First, when the amplification control device 10 is delivered from a factory manufacturing the amplification control device 10, an appropriate control signal is acquired (S100).

It should be noted that the appropriate control signal is a digital control signal which provides a desired analog output signal when a predetermined analog input signal is fed to the variable-gain amplifier 2. In this regard, however, the desired analog output signal is an analog output signal containing signals of multiple frequency components, the level of a signal of a desired frequency component out of the multiple frequency components being a constant desired value.

The appropriate control signal is stored in the flip-flop (control signal recording means) 166 when the predetermined analog input signal is fed to the variable-gain amplifier 2, and the desired analog output signal is obtained (referred to as "desired state"). Then, it is possible to acquire the appropriate control signal by reading out the record in the flip-flop 166 in the desired state. It should be noted that the desired state can be realized by feeding the predetermined analog input signal to the variable-gain amplifier 2, and operating the amplification control device 10 as described according to the first embodiment. The operation of the amplification control device 10 on this occasion is similar to that of the first embodiment, and hence a description thereof is omitted.

After the appropriate control signal is acquired (S100), the amplification control device 10 is delivered, and the amplification control device 10 is passed into the hands of a user. The amplification control device 10 is used by the user.

When the amplification control device 10 is used, the appropriate control signal is first recorded in the flip-flop 166 of the amplification control device 10 (S202). For example, the appropriate control signal acquired upon the delivery from the factory is written to the flip-flop 166. Then, the appropriate control signal is converted by the D/A converter 6 into the analog control signal, and the analog control signal is fed to the variable-gain amplifier 2 (S204). On this occasion, the amplification factor (or gain) of the variable-gain amplifier 2 is an amplification factor (or gain) of the variable-gain amplifier 2 in the desired state.

Then, the predetermined analog input signal is input to the variable-gain amplifier 2 (S206). Since the amplification factor (or gain of the variable-gain amplifier 2 has become the amplification factor (or gain) of the variable-gain amplifier 2 in the desired state, the desired analog output signal is acquired (S208).

It should be noted that, after the desired state is realized when the appropriate control signal is acquired (S100), and before the desired analog output signal is acquired again (S208), the appropriate control signal is recorded in the flip-flop 166 (S202).

According to the third embodiment of the present invention, when the appropriate control signal has been acquired in the desired state (S100), the desired analog output signal can be acquired at a high speed, since it is not necessary to operate the component acquisition means 12 and the differentiating means 14, but it is only necessary to operate the flip-flop 166 and the D/A converter 16, in order to acquire the desired analog output signal again (S208).

Though there has been given the description that the acquisition of the appropriate control signal (S100) is carried out upon the delivery from the factory, a user may acquire the appropriate control signal.

Moreover, though there has been given the description that the acquisition of the appropriate control signal (S100) is realized by operating the amplification control device 10 as described in the first embodiment, the appropriate control signal may be calculated and acquired based on the predetermined analog input signal and the desired analog output signal without operating the amplification control device 10. It should be noted that, whether the appropriate control signal is acquired by the calculation or by realizing the desired state, the both cases make no difference to the fact that, before the desired analog output signal is acquired (S208), the appropriate control signal is recorded in the flip-flop 166 (S202).

Fourth Embodiment

The amplification control device 10 according to the fourth embodiment of the present invention is constructed by adding frequency lowering means 20 to the amplification control device 10 of the first embodiment.

Figure 8:
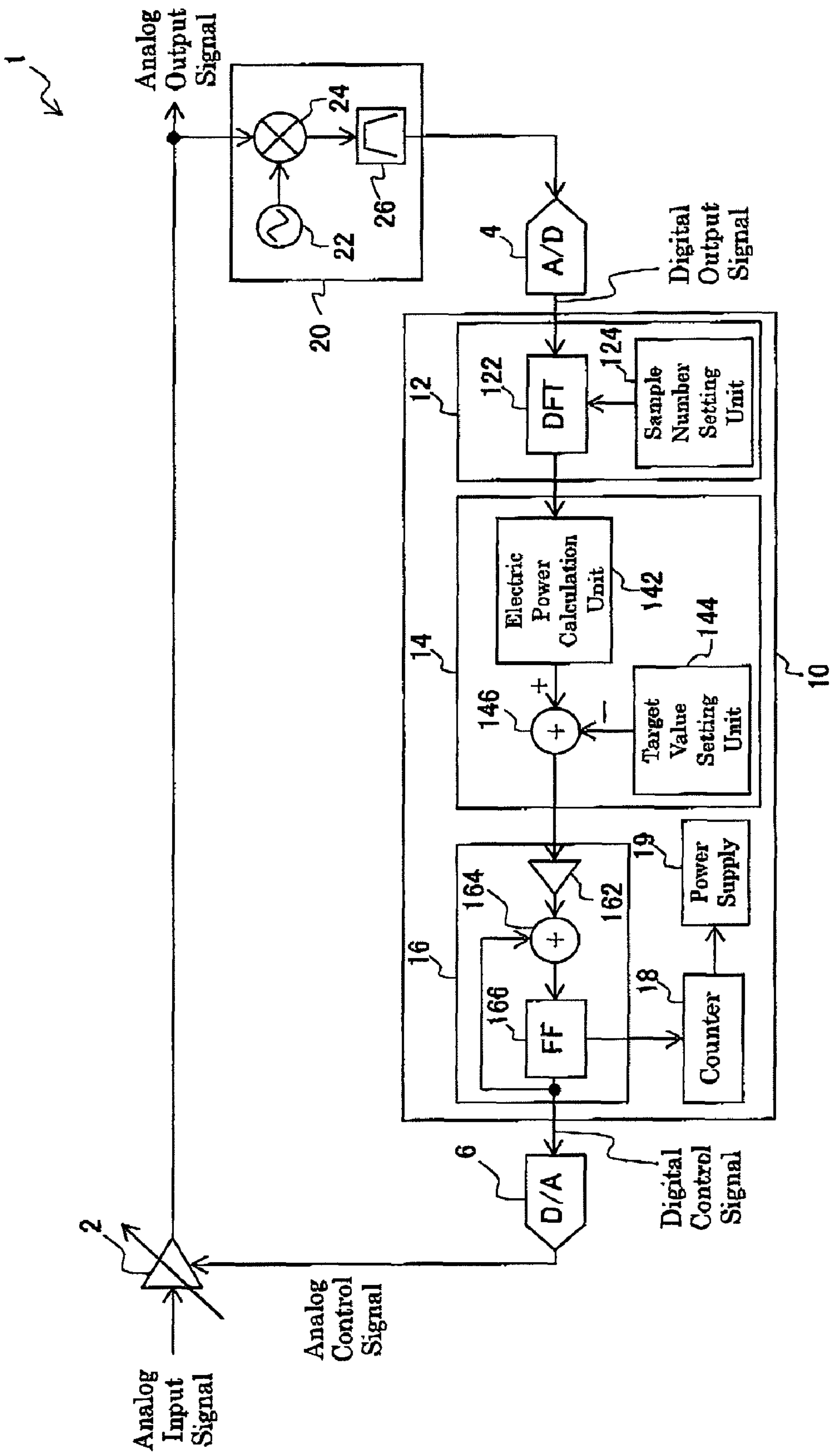
FIG. 8 is a block diagram showing a configuration of the amplification control device 10 according to the fourth embodiment of the present invention.

FIG. 8 is a block diagram showing a configuration of the amplification control device 10 according to the fourth embodiment of the present invention. The amplification control device 10, the variable-gain amplifier 2, and the D/A converter 6 are the same as those of the first embodiment, and a description thereof is, therefore, omitted.

The frequency lowering means 20 lowers the frequency of the analog output signal. The frequency lowering means 20 includes a local oscillator 22, a mixer 24, and a band-pass filter 26. The local oscillator 22 generates a local signal. The mixer 24 mixes the local signal and the analog output signal by multiplying them by each other. The band-pass filter 26 is a filter for passing a signal in a predetermined band for extracting a signal which is obtained by lowering the frequency of the analog output signal (signal in a lower sideband) from an output of the mixer 24.

The A/D converter 4 converts the output (signal obtained by lowering the frequency of the analog output signal) of the band-pass filter 26 of the frequency lowering means 20 into digital form, and outputs the digital output signal.

An operation of the fourth embodiment is the same as that of the first embodiment. However, the operation of the fourth embodiment is different from the operation of the first embodiment in that the frequency of the analog output signal is lowered by the frequency lowering means 20 and the analog output signal is then fed to the A/D converter 4.

The amplification control device 10 processes the digital signals, and it is thus hard for the amplification control device 10 to process a signal at a high frequency. However, according to the fourth embodiment, even if the frequency of the analog output signal is high, since the frequency lowering means 20 lowers the frequency, the amplification control device 10 can apply the digital processing. As a result, even if the frequency of the analog output signal is high, the fourth embodiment can provide the same effects as of the first embodiment.

It should be noted that the configuration according to the fourth embodiment, namely the configuration that the frequency lowering means 20 is provided before the A/D converter 4, can be applied to the amplification control device 10 according to the second and third embodiments.

Figure 9:
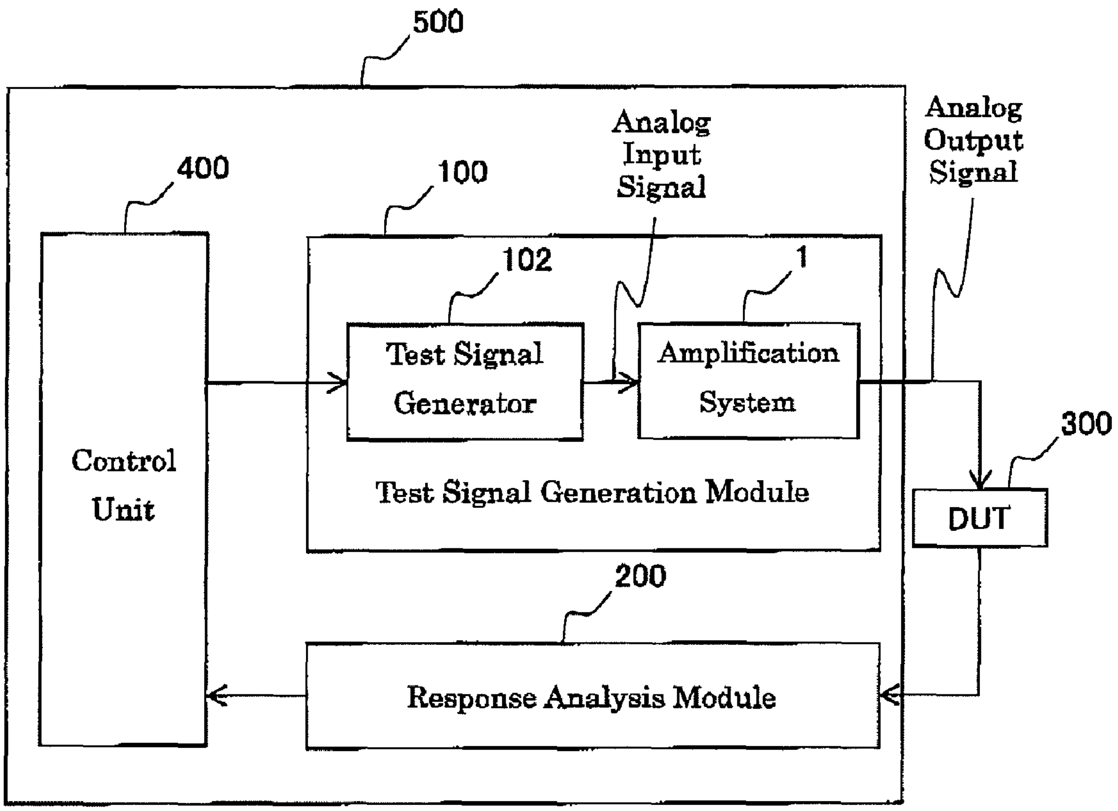
FIG. 9 is a functional block diagram showing a configuration of a test device 500 provided with the amplification system 1.

It should be noted that a test device can be constructed by the amplification system 1 (FIGS. 1, 3, and 8) provided with the amplification control device 10. FIG. 9 is a functional block diagram showing a configuration of a test device 500 provided with the amplification system 1.

The test device 500 is a device which includes a test signal generation module 100, a response analysis module 200, and a control unit 400, and tests a device under test (DUT) 300.

An analog output signal is fed to the DUT 300 from the amplification system 1. When the analog output signal is fed, a response is output from the DUT 300.

The test signal generation module 100 includes the amplification system 1 and a test signal generator 102. The amplification system 1 includes the variable-gain amplifier 2, the A/D converter 4, the D/A converter 6, and the amplification control device 10. The amplification system 1 is the same as that of the above-described embodiments, and hence a detailed description thereof is omitted. The test signal generator 102 generates a test signal for testing the DUT 300. The test signal serves as the analog input signal fed to the amplification system 1.

The response analysis module 200 analyzes a response from the DUT 300. Contents of the analysis are the same as those of widely known test devices, and hence a detailed description is omitted. For example, the response analysis module 200 obtains a power of a frequency component contained in the response from the DUT 300.

The control unit 400 controls the test signal generator 102 based on the operation of the response analysis module 200. The operation of the control unit 400 is the same as those of widely known test devices, and hence a detailed description is omitted. For example, the control unit 400, upon receiving a signal indicating that the analysis has been finished from the response analysis module 200, causes the test signal generator 102 to generate a new test signal.

In the example shown in FIG. 9, one set of the test signal generation module 100 and the response analysis module 200 is connected to the control unit 400. However, multiple sets of the test signal generation module 100 and the response analysis module 200 are generally connected to the control unit 400. Moreover, the test signal generation module 100 and the response analysis module 200 can be integrated into a single module.

Moreover, the above-described embodiment may be realized in the following manner. A computer is provided with a CPU, a hard disk, and a media (such as a floppy disk (registered trade mark) and a CD-ROM) reader, and the media reader is caused to read a medium recording a program realizing the above-described respective components (such as the component acquisition means 12, the differentiating means 14, the digital control signal output means 16, and the counter 18 of the amplification control device 10), thereby installing the program on the hard disk. This method may also realize the above-described functions.

The invention claimed is:

1. An amplification control device for controlling an amplifier, an amplification factor of which is controlled based on an analog control signal, and which amplifies an analog input signal and outputs an analog output signal, comprising:

a component acquirer that transforms, by the discrete Fourier transform, a digital output signal converted from the analog output signal into digital form, thereby acquiring a desired frequency component of the digital output signal;

a differentiator that acquires a difference between the electric power of the frequency component acquired by the component acquirer and a target value of the electric power of the frequency component; and a digital control signal outputter that outputs, based on the difference acquired by the differentiator, a digital control signal for controlling the amplification factor of the amplifier, wherein the analog control signal is obtained by converting the digital control signal into analog form, wherein the digital control signal outputter comprises a control signal recorder that records the digital control signal, wherein the control signal recorder records, before a desired analog output signal is obtained, an appropriate control signal which is the digital control signal causing the desired analog output signal to be obtained when a predetermined analog input signal is fed to the amplifier, and wherein the appropriate control signal is calculated based on the predetermined analog input signal and the desired analog output signal.

2. The amplification control device according to claim 1, comprising a sample number setter that sets the number of samples used in the discrete Fourier transform carried out by the component acquirer, wherein the sample number setter sets the number of the samples, such that the number of samples in $(P+1)^{th}$ discrete Fourier transform carried out by the component acquirer can be larger than the number of samples in $P^{th}$ discrete Fourier transform, where P is a positive integer.

3. The amplification control device according to claim 2, wherein the sample number setter increases the number of samples when the number of times of the discrete Fourier transform carried out by the component acquirer exceeds a predetermined number of times.

4. The amplification control device according to claim 1, wherein the digital output signal is obtained by lowering the frequency of the analog output signal, and converting the resulting signal into digital form.

5. A test signal generation module comprising:

the amplification control device according to claim 1;

the amplifier;

an A/D converter that converts the analog output signal into digital form;

a D/A converter that converts the digital control signal into analog form; and a test signal generator that generates a test signal for testing a device under test to which the analog output signal is fed, wherein the test signal is the analog input signal.

6. A test device comprising:

the test signal generation module according to claim 5;

a response analysis module that analyzes a response of the device under test when the analog output signal is fed; and a controller that controls the test signal generator based on an operation of the response analysis module.

7. An amplification control method for controlling an amplifier, an amplification factor of which is controlled based on an analog control signal, and which amplifies an analog input signal and outputs an analog output signal, comprising:

component acquiring that transforms, by the discrete Fourier transform, a digital output signal converted from the analog output signal into digital form, thereby acquiring a desired frequency component of the digital output signal;

differentiating that acquires a difference between the electric power of the frequency component acquired by the component acquiring and a target value of the electric power of the frequency component; and digital control signal outputting that outputs, based on the difference acquired by the differentiating, a digital control signal for controlling the amplification factor of the amplifier, wherein the analog control signal is obtained by converting the digital control signal into analog form, wherein the digital control outputting comprises recording the digital control signal in a control signal recorder, wherein the control signal recorder records, before a desired analog output signal is obtained, an appropriate control signal which is the digital control signal causing the desired analog output signal to be obtained when a predetermined analog input signal is fed to the amplifier, and wherein the appropriate control signal is calculated based on the predetermined analog input signal and the desired analog output signal.

8. A computer-readable medium having a program of instructions for execution by a computer to perform an amplification control process for controlling an amplifier, an amplification factor of which is controlled based on an analog control signal, and which amplifies an analog input signal and outputs an analog output signal, said amplification control process comprising:

component acquiring that transforms, by the discrete Fourier transform, a digital output signal converted from the analog output signal into digital form, thereby acquiring a desired frequency component of the digital output signal;

differentiating that acquires a difference between the electric power of the frequency component acquired by the component acquiring and a target value of the electric power of the frequency component; and digital control signal outputting that outputs, based on the difference acquired by the differentiating, a digital control signal for controlling the amplification factor of the amplifier, wherein the analog control signal is obtained by converting the digital control signal into analog form, wherein the digital control outputting comprises recording the digital control signal in a control signal recorder, wherein the control signal recorder records, before a desired analog output signal is obtained, an appropriate control signal which is the digital control signal causing the desired analog output signal to be obtained when a predetermined analog input signal is fed to the amplifier, and wherein the appropriate control signal is calculated based on the predetermined analog input signal and the desired analog output signal.

9. An amplification control device for controlling an amplifier, an amplification factor of which is controlled based on an analog control signal, and which amplifies an analog input signal and outputs an analog output signal, comprising:

a component acquirer that transforms, by the discrete Fourier transform, a digital output signal converted from the analog output signal into digital form, thereby acquiring a desired frequency component of the digital output signal;

a differentiator that acquires a difference between the electric power of the frequency component acquired by the component acquirer and a target value of the electric power of the frequency component; and a digital control signal outputter that outputs, based on the difference acquired by the differentiator, a digital control signal for controlling the amplification factor of the amplifier, wherein the analog control signal is obtained by converting the digital control signal into analog form, wherein the digital control signal outputter comprises a control signal recorder that records the digital control signal, wherein the control signal recorder records, before a desired analog output signal is obtained, an appropriate control signal which is the digital control signal causing the desired analog output signal to be obtained when a predetermined analog input signal is fed to the amplifier, wherein the appropriate control signal is recorded in the control signal recorder in a state in which the predetermined analog input signal is fed to the amplifier, and the desired analog output signal is obtained, and wherein the control signal recorder records the appropriate control signal before the desired analog output signal is obtained again after the state.

10. The amplification control device according to claim 9, comprising a sample number setter that sets the number of samples used in the discrete Fourier transform carried out by the component acquirer, wherein the sample number setter sets the number of the samples, such that the number of samples in $(P+1)^{th}$ discrete Fourier transform carried out by the component acquirer can be larger than the number of samples in $P^{th}$ discrete Fourier transform, where P is a positive integer.

11. The amplification control device according to claim 10, wherein the sample number setter increases the number of samples when the number of times of the discrete Fourier transform carried out by the component acquirer exceeds a predetermined number of times.

12. The amplification control device according to claim 9, wherein the digital output signal is obtained by lowering the frequency of the analog output signal, and converting the resulting signal into digital form.

13. A test signal generation module comprising:

the amplification control device according to claim 9;

the amplifier;

an A/D converter that converts the analog output signal into digital form;

a D/A converter that converts the digital control signal into analog form; and a test signal generator that generates a test signal for testing a device under test to which the analog output signal is fed, wherein the test signal is the analog input signal.

14. A test device comprising:

the test signal generation module according to claim 13;

a response analysis module that analyzes a response of the device under test when the analog output signal is fed; and a controller that controls the test signal generator based on an operation of the response analysis module.

15. An amplification control method for controlling an amplifier, an amplification factor of which is controlled based on an analog control signal, and which amplifies an analog input signal and outputs an analog output signal, comprising:

component acquiring that transforms, by the discrete Fourier transform, a digital output signal converted from the analog output signal into digital form, thereby acquiring a desired frequency component of the digital output signal;

differentiating that acquires a difference between the electric power of the frequency component acquired by the component acquiring and a target value of the electric power of the frequency component; and digital control signal outputting that outputs, based on the difference acquired by the differentiating, a digital control signal for controlling the amplification factor of the amplifier, wherein the analog control signal is obtained by converting the digital control signal into analog form, wherein the digital control outputting comprises recording the digital control signal in a control signal recorder, wherein the control signal recorder records, before a desired analog output signal is obtained, an appropriate control signal which is the digital control signal causing the desired analog output signal to be obtained when a predetermined analog input signal is fed to the amplifier, wherein the appropriate control signal is recorded in the control signal recorder in a state in which the predetermined analog input signal is fed to the amplifier, and the desired analog output signal is obtained, and wherein the control signal recorder records the appropriate control signal before the desired analog output signal is obtained again after the state.

16. A computer-readable medium having a program of instructions for execution by a computer to perform an amplification control process for controlling an amplifier, an amplification factor of which is controlled based on an analog control signal, and which amplifies an analog input signal and outputs an analog output signal, said amplification control process comprising:

component acquiring that transforms, by the discrete Fourier transform, a digital output signal converted from the analog output signal into digital form, thereby acquiring a desired frequency component of the digital output signal;

differentiating that acquires a difference between the electric power of the frequency component acquired by the component acquiring and a target value of the electric power of the frequency component; and digital control signal outputting that outputs, based on the difference acquired by the differentiating, a digital control signal for controlling the amplification factor of the amplifier, wherein the analog control signal is obtained by converting the digital control signal into analog form, wherein the digital control outputting comprises recording the digital control signal in a control signal recorder, wherein the control signal recorder records, before a desired analog output signal is obtained, an appropriate control signal which is the digital control signal causing the desired analog output signal to be obtained when a predetermined analog input signal is fed to the amplifier, wherein the appropriate control signal is recorded in the control signal recorder in a state in which the predetermined analog input signal is fed to the amplifier, and the desired analog output signal is obtained, and wherein the control signal recorder records the appropriate control signal before the desired analog output signal is obtained again after the state.

* * * * *